United States Patent [19]
Hush et al.

[11] Patent Number: 5,703,826
[45] Date of Patent: Dec. 30, 1997

[54] VIDEO RANDOM ACCESS MEMORY CHIP CONFIGURED TO TRANSFER DATA IN RESPONSE TO AN INTERNAL WRITE SIGNAL

[75] Inventors: Glen Hush, Bosie; Mike Seibert, Eagle; Jeff Mailloux; Mark R. Thomann, both of Boise, all of Id.

[73] Assignee: Micron Technology, Inc., Boise, Id.

[21] Appl. No.: 619,285

[22] Filed: Mar. 18, 1996

Related U.S. Application Data

[62] Division of Ser. No. 69,967, May 28, 1993, Pat. No. 5,506,814.

[51] Int. Cl.$^6$ ............................................. G11C 8/00
[52] U.S. Cl. ...................... 365/230.05; 365/221; 365/239
[58] Field of Search .......................... 365/230.05, 221, 365/239, 230.01, 220, 230.03, 233

[56] References Cited

U.S. PATENT DOCUMENTS

| | | | |
|---|---|---|---|
| 4,604,695 | 8/1986 | Widen et al. | 364/200 |
| 4,636,986 | 1/1987 | Pinkham | 365/195 |
| 4,675,850 | 6/1987 | Kumanoya et al. | 365/230 |
| 4,695,967 | 9/1987 | Kodama et al. | 364/521 |
| 4,725,987 | 2/1988 | Cates | 365/220 |
| 4,779,232 | 10/1988 | Fukunaka et al. | 365/189 |
| 4,847,809 | 7/1989 | Suzuki | 365/189.04 |
| 4,875,189 | 10/1989 | Obara | 365/189.04 |
| 4,876,671 | 10/1989 | Norwood et al. | 365/233 |
| 4,879,685 | 11/1989 | Takemae | 365/189.11 |
| 4,881,206 | 11/1989 | Kadono | 365/227 |
| 4,958,326 | 9/1990 | Sakurai | 365/218 |
| 5,042,013 | 8/1991 | Sato | 365/230.05 |
| 5,313,431 | 5/1994 | Uruma et al. | 365/230.05 |
| 5,381,376 | 1/1995 | Kim et al. | 365/230.03 |

OTHER PUBLICATIONS

1992 DRAM Electrical data book, Micron Technology, Inc. pp. 2/115–2/131.

*Primary Examiner*—David C. Nelms
*Assistant Examiner*—F. Niranjan
*Attorney, Agent, or Firm*—Susan B. Collier

[57] ABSTRACT

The invention is a monolithic video random access memory (VRAM) chip that has more than one write control pin which is used to segment the VRAM into banks or sub-chips having four DQ planes such that a nibble of data can be written to the VRAM. Using the method of the invention a first bank may be written independently of a second bank, such that during a single memory cycle the first bank may be written and the second bank may be read. Using the circuit of the invention data is transferred in response to an internal write signal. The VRAM of the invention functions without the masking of a write to either bank. In addition the write memory function can be performed either through the random access memory port or through the serial access memory port.

12 Claims, 4 Drawing Sheets

VIDEO RANDOM ACCESS MEMORY CHIP CONFIGURED TO TRANSFER DATA IN RESPONSE TO AN INTERNAL WRITE SIGNAL

This application is a divisional of application Ser. No. 08/069,967, filed May 28, 1993 now U.S. Pat. No. 5,506,814 Ser. Nos. 07/730,366 and 07/730,367 have related subject matter to the captioned application. Co-pending is U.S. patent application Ser. No. 08/618,292 which is a divisional of the instant application's parent, U.S. Pat. No. 5,508,614.

FIELD OF THE INVENTION

The invention relates to memory devices and, more particularly, to semiconductor memories having video random access memories.

BACKGROUND OF THE INVENTION

In integrated circuit (IC) memory products, such as dynamic random access memories (DRAMs) and video random access memories (VRAMs), the amount of available memory on a monolithic chip is often referred to as the density. Density describes the total amount of memory fabricated on the circuit of the chip, such as 1 meg, 4 meg, and so forth.

FIG. 1 depicts a common DRAM array 5 containing a large number of memory storage cells 10. Each memory storage cell 10 is addressable by a unique row 15 and a unique column 20 address. If there are n rows 15 and m columns 20 the density is equal to nxm. In the example the density is equal to 8×2 or 16.

A memory device, such as DRAM array 5, accepts electrical data for storage through an input often called the "D" input. Electrical data read from the memory would be presented on an output called the "Q" output. In order to keep the package small the input and output functions are commonly combined to share the same pin which is now called a "DQ" pin 25. In the example, the complementary electrical data is available on the D/Q* pin 30.

FIG. 2 is a simplified block schematic of memory array 5 of FIG. 1. In FIG. 2 the block schematic indicates the actual manner in which the rows and columns are configured, 8×2. However when referring to a chip it is typically described by its total density, in this case 16.

Memory vendors often provide more than one configuration of a certain density product to better suit the needs of the consumer. In some popular variations the memory is split into 4, 8, 16 or more equal segments. These segments are accessed in parallel. Each segment of the array can be thought of as a subarray having a given density. Often m and n are equal in each subarray. The number of subarrays is referred to as the width of the memory array. In a memory containing subarrays, less row and column addresses are required for a total given memory capability since the density of each subarray is only a portion of the total memory density, and since the subarrays typically respond to the same row and column address. Such a configuration multiplies the "D" and "Q" pins required for transferring electrical data into and out of the IC. Each "DQ" pin services one of the afore mentioned subarrays which is then often referred to as a "DQ plane."

The division of the memory array into equal sided and commonly addressed DQ planes is very useful in certain systems which use IC memory. The various available configurations are often referred to as "by one", "by four", "by eight" and so forth. For example a 1 meg VRAM may be split into 4 DQ planes and is then referred to as a 256K×4.

Computers handle data in chunks of 8 bits at a time, so a by 8 product is appealing as a configuration for some monolithic memory chips. A by 16 product is also appealing for monolithic chips having high bandwidth applications. Since computers work on 8 bits at a time, at the by 16 level a method of writing to only 8 bits at a time is needed. This problem is solved by putting either two write control pins or two CAS pins on these chips.

For example, pages 2-115 through 2-131 of the 1992 DRAM Electrical data book by Micron Technology, Inc. describe the circuit configuration, timing, and functions of a MT4C1664/5L and are herein incorporated by reference to provide the reader with further information. The MT4C1664/5L is a 64K×16 monolithic DRAM memory chip featuring two write control input pins. One write control input pin accepts a WEL* signal and the remaining write control input pin accepts a WEH* signal, thereby allowing for a byte write access cycle. WEH* is the write enable signal to the upper byte which is represented by data at DQ9 through DQ16. WEL* is the write enable signal to the lower byte which is represented by data at DQ1 through DQ8. In this case WEL* and WEH* function in an identical manner to the typical normally low write enable (WE*) signal of a DRAM featuring a single write control input pin. Either WEL* or WEH* will generate an internal WE* through an AND gate. Thus if either WEL* or WEH* is active the entire chip goes into a write mode. However, only the bank having the active signal actually writes. The device can write to a byte or block the write to the byte. The block of the write to the byte is also known as masking of the write function. There is no Byte read cycle.

FIG. 3 is an example of a 2 Meg 256K×8 monolithic VRAM chip 34. A VRAM is a dual port DRAM used to store electrical data which can represent video images on a video monitor. When the electrical data represents video images it is referred to as video data. The serial access memory (SAM) port 35 accepts output video data from a SAM array portion 36 of the VRAM in a read mode and accepts external input video data in a write mode. Video data for controlling video images transfers quickly between the SAM 36 and SDQs 1–8 at the SAM port 35 either as video input or video output data. Random access memory (RAM) port 37 accepts internal digital electrical data from a DRAM array portion 38 of the VRAM in a read mode and accepts external digital electrical data in a write mode.

The DRAM portion 38 of the 2 Meg memory has been split into 8 DQ planes or subarrays. Each plane has a density of 256K. In a normal write, data is simultaneously written to a memory cell in each DQ plane. One address determines which cell is written, and each selected cell has the same address location in each DQ plane. Since eight cells are written, a byte of information is stored in the array during the normal write operation. During a block write, a block of cells are written in each DQ plane. Address input port 39 receives signals for addressing the selected memory storage cell within each DQ plane.

Row address strobe (RAS), column address strobe (CAS), transfer or output enable (TR/OE), input special function (DSF), serial clock (SC), and write enable (WE) are external input signals on external input pins 40, 45, 50, 55, 60, and 65, respectively. These external input signals control internal timing and operation of a logic control generator 66. The logic control generator 66 generates an internal write signal, $W_1$. These input signals are well known to those skilled in the art. Descriptions of the circuit configuration, timing, and functions of the 2 Meg MT42C8256 are found on pages 5–111 through 5–152 of the 1992 DRAM Electrical data BOOK by Micron Technology, Inc. and are herein incorporated by reference. The MT42C8256 is similar to the 2 Meg shown in FIG. 3.

In order to better understand the function of $W_1$ it is necessary to have a better understanding of the configuration shown in FIG. 3. The SAM has been split into 8 subarrays in order that data may be transferred between a SAM subarray and a corresponding DQ subarray. Transfer gates 77, when activated, transfer electrical data between the DRAM portion 38 of the chip 34 and the SAM portion 36. A write transfer occurs when the data is transferred from the SAM to the DRAM, and read transfer occurs when the data is transferred from the Dram to the SAM. The control signal $W_1$ controls the operation of the transfer gates 77.

In the normal and block write modes electrical digital data is read from or written to the DRAM portion 38. $W_1$ controls the normal and block write operation through the normal and block write control unit 80.

Due to the fact that ASCII codes need 8 bits of information, no less than 8 subarrays have typically been written at any one time. In this type of accessing a byte of electrical data can be written. However, when processing graphic data, a VRAM may have to work with a chunk of data at one time having 4, 8, 12, 16, 24, or 32 bits. This is due to the fact that the VRAM may be processing either gray scale or color data. There exists a need to provide a VRAM wherein a nibble of electrical data can be written to the monolithic memory chip. A need also exists to control the write to individual banks in the memory array independently of one another in order that one bank may be written during the same memory cycle that another bank is read.

SUMMARY OF THE INVENTION

The invention is a monolithic memory chip having at least two external write control pins for accepting and responding to at least two external write enable signals. Subarrays of the memory chip are divided into at least two portions or banks wherein each portion is seen as an individual memory sub-chip with respect to its external write control pin. In the method of the invention the chip generates at least two internal write signals, $W_1$ and $W_2$, in response to the external write enable signals. Each internal write signal controls write functions to one of the sub-chips. During a single memory cycle a first sub-chip can be written independently of a second sub-chip. Therefore the second sub-chip may be read during the memory cycle in which the write of the first sub-chip is being performed. Similarly a write transfer can be executed on one sub-chip and a read transfer executed on another sub-chip during a single memory cycle.

In a further embodiment of the invention each sub-chip comprises four subarrays, and the inventive method allows the user to write a nibble of data to the VRAM.

It is an advantage of the invention that any sub-chip of subarrays can be written independent of the other sub-chips. This can be accomplished through the RAM port during a normal or during a block write operation or through the SAM port during a write transfer operation. Thus the VRAM of the invention provides more versatility to the designer than previous VRAMs. Each sub-chip is not automatically put in a write mode in the circuit of the invention.

DETAILED DESCRIPTION OF THE INVENTION

Figure 1:
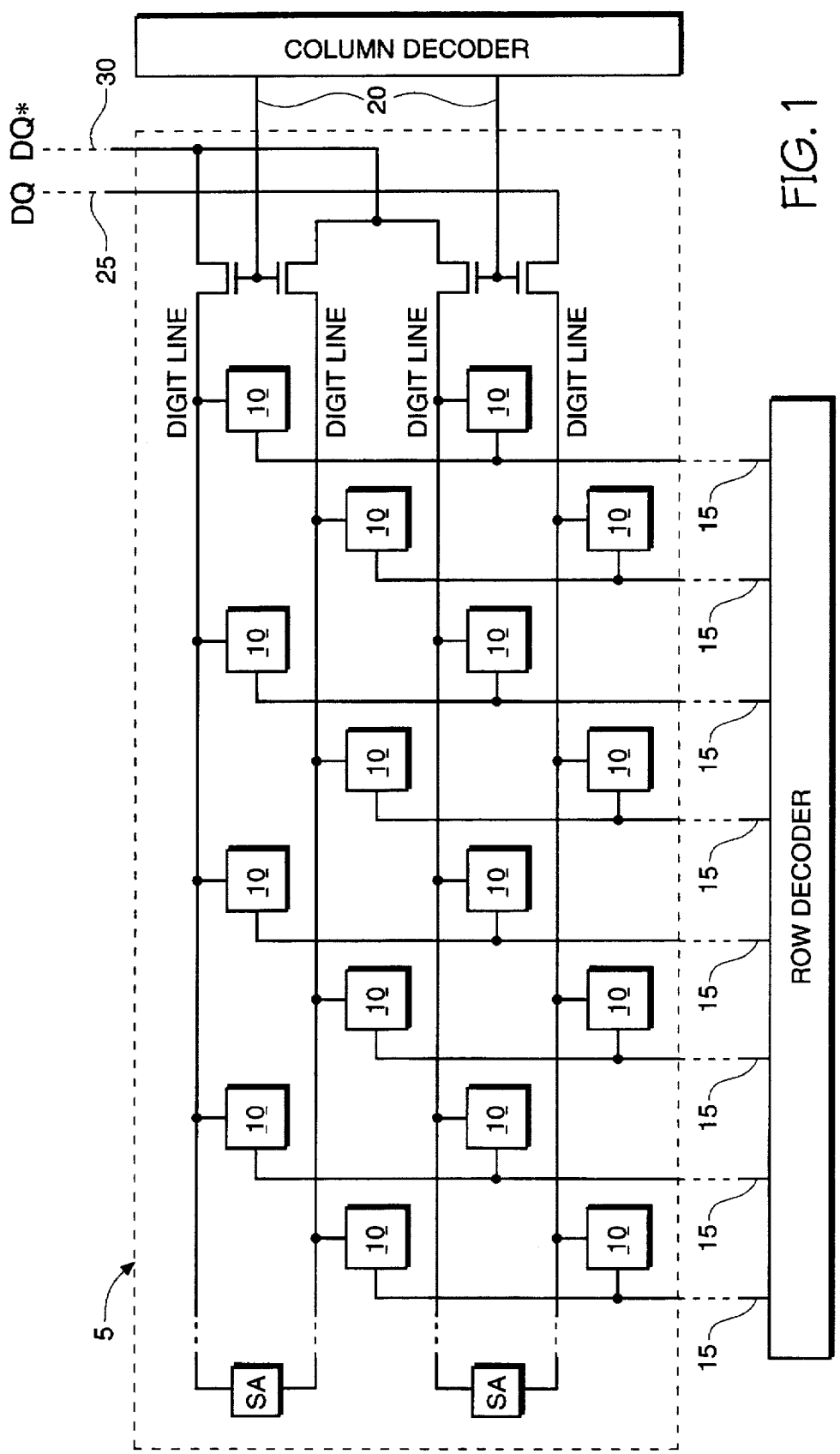
FIG. 1 is a block schematic of a monolithic dynamic random access memory array of the related art.
Figure 2:
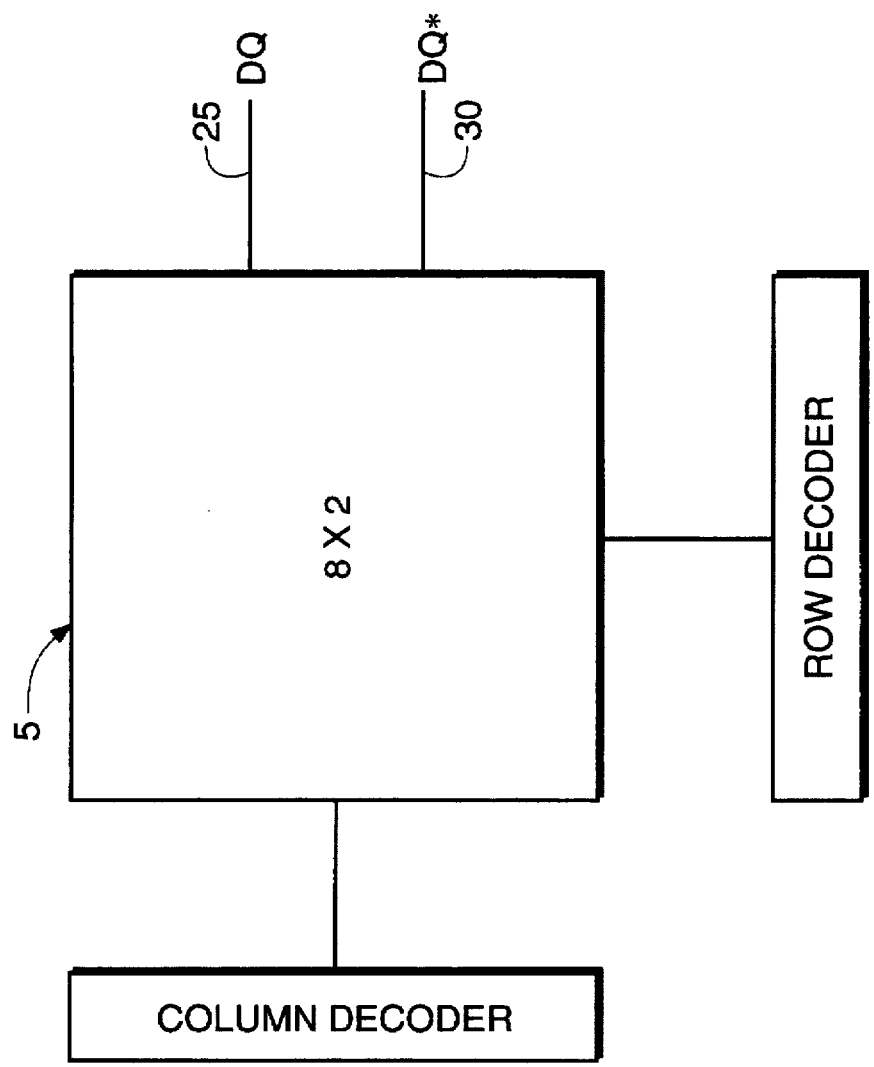
FIG. 2 is a block diagram of the schematic of FIG. 1.
Figure 3:
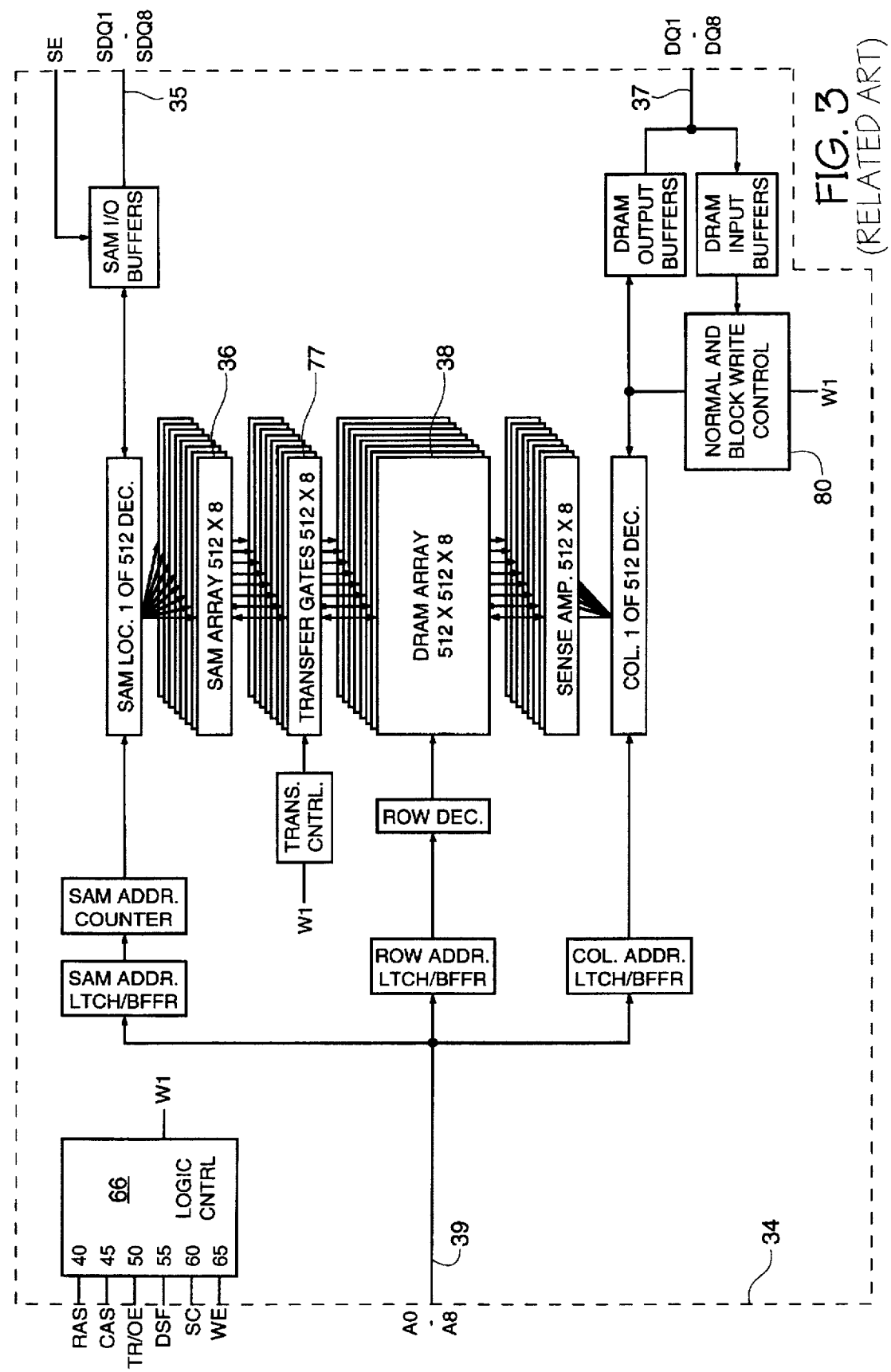
FIG. 3 is a block diagram of a monolithic video random access memory (VRAM) chip the related art.
Figure 4:
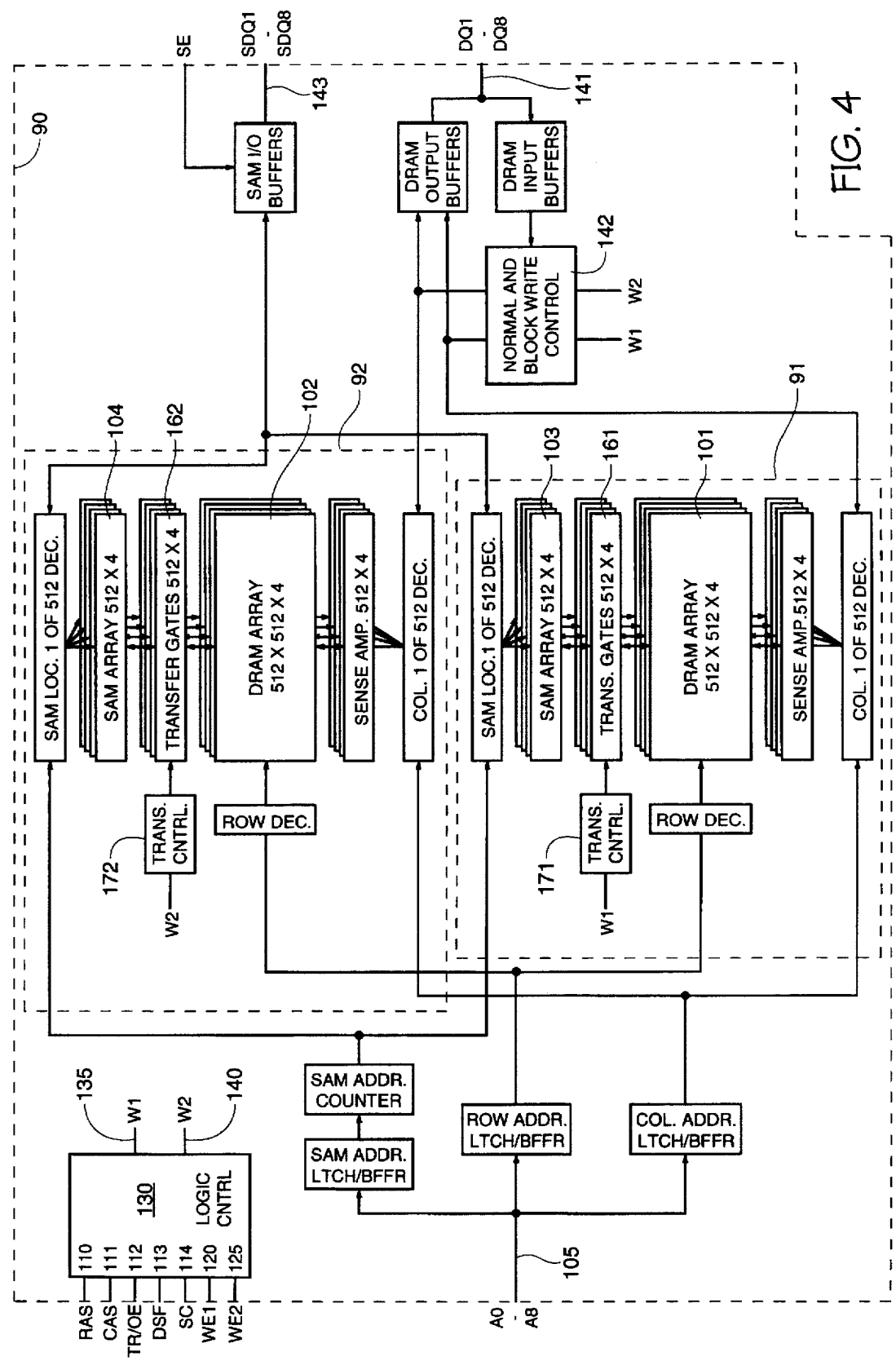
FIG. 4 is a block diagram of the monolithic VRAM chip of the invention.

FIG. 4 is a block diagram of an embodiment of the invention featuring a monolithic video random access memory (VRAM) chip 90. The VRAM 90 of FIG. 4 consists of two sub-chips 91 and 92. Each sub-chip 91 and 92 has a dynamic random memory (DRAM) bank 101 and 102, respectively, of four subarrays and a serial access memory (SAM) bank 103 and 104, respectively, of four subarrays. Each subarray of DRAM banks 101 and 102 is a dynamic random access memory having a matrix of memory storage cells formed at an intersection of a row and a column. An address on address input port 105 determines a row and column location. Each row and column location selects a corresponding memory storage cell in each subarray. In the circuit of FIG. 4 each subarray has a density equal to 256K. Since there are 4 subarrays in each subchip 91 and 92, each subchip 91 and 92 is configured as a 256K×4. Since there are two subchips the total density of the chip 90 is equal to 2 Meg.

External input pins 110, 111, 112, 113, and 114 receive external input signals RAS, CAS, TR/OE, DSF and SC respectively, where RAS is a row address strobe signal, CAS is a column address strobe signal, TR\OE is either a transfer or an output enable signal, DSF is an input special function signal, and SC is a serial clock signal. External write control pin 120 receives a first external input write enable signal, and external write control pin 125 receives a second external input write enable signal. The input signals are responsible for controlling the transfer of data within the chip and are well known to those skilled in the art. An internal timing and logic control generator 130 generates two internal write signals, $W_1$ and $W_2$, at logic control circuit output nodes 135 and 140 in response to external signals RAS, CAS, TR\OE, DSF, $WE_2$, and $WE_1$. $W_1$ controls normal write operations, block write operations, and write transfer operations to sub-chip 91, and $W_2$ controls normal write operations, block write operations, and write transfer operations to sub-chip 92. Thus, each subarray 91 and 92 behaves as an independent sub-chip, and one sub-chip may be written while the other is read without the necessity of masking a write operation to the sub-chip being read.

Electrical digital data from a central processing unit (CPU), not shown, is available at DQs 1–8 at RAM port 141. The electrical data from the CPU can be written during either normal or block write operations. $W_1$ and $W_2$ are input signals to a normal and block write control circuit 142. The normal and block write control circuit generates a signal in response to $W_1$ and generates a signal in response to $W_2$ in order to control the normal and block writes in DRAM banks 101 and 102 respectively. Although a write operation may be performed to both banks during a single memory cycle one bank may be written while the other is read. For example, if $W_1$ is active for a block write to bank 101 and $W_2$ is inactive, a group of cells in each subarray of DRAM bank 101 is written. During the same cycle a read operation can be performed in DRAM bank 102. In another example, a cell is selected and written to in each subarray of DRAM bank 102 in a normal write operation, while a read operation is performed in DRAM bank 101.

In a write transfer operation electrical data is transferred from storage in the serial access memory (SAM) bank for storage in the corresponding DRAM bank. In this case the electrical data is video data. In FIG. 4 the SAM banks 103 and 104 are electrically coupled to a SAM port 143 having SDQs 1–8. SDQs are DQs for coupling video data to and from a SAM. The SAM banks 103 and 104 receive video input data from the SDQs for storage during a serial write operation and video data stored in the SAM banks 103 and 104 is read at the SDQs during a serial read operation. For each DRAM subarray there exists a corresponding SAM subarray. Transfer gates are electrically interposed between each SAM bank and its corresponding DRAM bank, and the transfer gates control the transfer of data between the two banks. A transfer control circuit 171 responds to internal write signal $W_1$, and transfer control circuit 172 responds to internal write signal $W_2$. Transfers control circuits 171 and 172 generate signals which control the activation and deactivation of the transfer gates 161 and 162 respectively. When activated by the transfer control circuit the transfer gates transfer a row of data between each SAM subarray and a corresponding DRAM subarray. The transfer of data from the SAM bank to the DRAM bank is known as a write transfer operation, and the transfer of data from the Dram bank to the SAM bank is known as a read transfer operation. With the circuit of the invention the write transfer operations of each bank are independent of each other. Thus a write transfer can be performed to one of the two banks during the same memory cycle that a read transfer operation is performed to the remaining bank.

Since each bank of the chip has four subarrays a write transfer from each of the 4 SAM subarrays to its corresponding four DRAM subarrays may be performed. For example, a row of data may be write transferred from each subarray of the SAM bank 103 to the DRAM bank 101 in response to an active $W_1$ at transfer control circuit 171. The transfer control circuit 171 generates a signal which activates the transfer gates 161 in order that the write transfer may be performed. If $W_2$ is inactive a read transfer operation may be performed in banks 102 and 104 during the same memory cycle, or if $W_2$ is active a write transfer of data from SAM bank 104 to DRAM bank 102 is performed during the same memory cycle. The memory functions of banks 102 and 104 are independent of the memory functions of banks 101 and 103, and the write transfer in one bank is performed without masking a write transfer in the remaining bank.

Thus using the circuit of the invention it is possible to perform a write operation to one bank of subarrays independent of the memory function performed in another bank of subarrays. Each bank can be written without masking a write to a bank not being written. Since each bank consists of four subarrays the circuit provides previously unheard of independent nibble control, wherein a nibble of data is written to the VRAM without masking.

Although the invention has been described in terms of a 2 Meg VRAM, the circuit and method have utility in other circuits where it is desired to write to a bank of subarrays independently of other banks on the chip without masking of the other banks. Accordingly the invention should be read as limited only by the claims.

What is claimed is:

1. A monolithic video random access memory chip, comprising:

a) a random access memory port for accepting first electrical data;

b) a serial access memory port for accepting second electrical data;

c) a first dynamic random access memory portion having a first plurality of memory storage cells for storing said first and said second electrical data, said first dynamic random access memory portion in electrical communication with said random access memory port;

d) a second dynamic random access memory portion having a second plurality of memory storage cells for storing said first and said second electrical data, said second dynamic random access memory portion in electrical communication with said random access memory port;

e) a first serial access memory portion electrically interposed between said first dynamic random access memory portion and said serial access memory port, said first serial access memory portion accepting and storing said first and said second electrical data from said first dynamic random access memory and from said serial access memory port;

f) a second serial access memory portion electrically interposed between said second dynamic random access memory portion and said serial access memory port, said second serial access memory portion accepting and storing said first and said second electrical data from said second dynamic random access memory and from said serial access memory port;

g) first transfer circuitry electrically interposed between said first serial access memory portion and said first dynamic random access memory portion, said first transfer circuitry for transferring said second electrical data between said first serial access memory portion and said first dynamic random access memory portion when activated by a first internal write signal; and h) second transfer circuitry electrically interposed between said second serial access memory portion and said second dynamic random access memory portion, said second transfer circuitry for transferring said second electrical data between said second serial access memory portion and said second dynamic random access memory portion when activated by a second internal write signal.

2. A video random access memory chip, comprising:

a) a random access memory port for accepting first electrical data;

b) a serial access memory port for accepting second electrical data;

c) a first dynamic random access memory portion having a first plurality of memory storage cells for storing said first and said second electrical data, said first dynamic random access memory portion in electrical communication with said random access memory port;

d) a second dynamic random access memory portion having a second plurality of memory storage cells for storing said first and said second electrical data, said second dynamic random access memory portion in electrical communication with said random access memory port;

e) a first serial access memory portion electrically interposed between said first dynamic random access memory portion and said serial access memory port, said first serial access memory portion accepting and storing said first and said second electrical data from said first dynamic random access memory and from said serial access memory port;

f) a second serial access memory portion electrically interposed between said second dynamic random access memory portion and said serial access memory port, said second serial access memory portion accepting and storing said first and said second electrical data from said second dynamic random access memory and from said serial access memory port; and wherein g) said first plurality of said memory storage cells are divided into a plurality of first subarrays, and wherein a first internal write signal controls a first block write operation to said first subarrays, said first block write operation performed in order to write said first electrical data to a plurality of said memory storage cells in each of said first subarrays, and wherein said first internal write signal controls a first write transfer operation, said first write transfer operation performed in order to write said second electrical data to a row of said memory storage cells in each of said first subarrays; and wherein said second plurality of memory storage cells are divided into a plurality of second subarrays, and wherein a second internal write signal controls a second block write operation to said second subarrays, said second block write operation performed in order to write said first electrical data to a plurality of said memory storage cells in each of said second subarrays, and wherein said second internal write signal controls a second write transfer operation, said second write transfer operation performed in order to write said second electrical data to a row of said memory storage cells in each of said second subarrays.

3. The video random access memory chip as specified in claim 2, wherein said plurality of said first subarrays comprises four subarrays thereby providing a first nibble of electrical data to said first dynamic random memory, and wherein said plurality of said second subarrays comprises four subarrays thereby providing a second nibble of electrical data to said second dynamic random memory.

4. The video random access memory chip as specified in claim 2, wherein said first block write operation is performed without masking of said second block write operation to said plurality of said second subarrays and wherein said second block write operation is performed with masking of said first block write operation to said plurality of said first subarrays.

5. The video random access memory chips specified in claim 2, wherein said first and said second block write operations are performed independently of one another.

6. The video random access memory chip as specified in claim 2, wherein said first write transfer operation is performed without masking of said second write transfer operation to said plurality of said second subarrays and wherein said second write transfer operation is performed without masking of said first write transfer operation to said plurality of said first subarrays.

7. The video random access memory chips specified in claim 2, wherein said first and said second write transfer operations are performed independently of one another.

8. A monolithic video random access memory chip, comprising:

a) a random access memory port for accepting first electrical data;

b) a serial access memory port for accepting second electrical data;

c) a first dynamic random access memory portion having a first plurality of memory storage cells for storing said first and said second electrical data, said first dynamic random access memory portion in electrical communication with said random access memory port;

d) a second dynamic random access memory portion having a second plurality of memory storage cells for storing said first and said second electrical data, said second dynamic random access memory portion in electrical communication with said random access memory port;

e) a first serial access memory portion electrically interposed between said first dynamic random access memory portion and said serial access memory port, said first serial access memory portion accepting and storing said first and said second electrical data from said first dynamic random access memory and from said serial access memory port;

f) a second serial access memory portion electrically interposed between said second dynamic random access memory portion and said serial access memory port, said second serial access memory portion accepting and storing said first and said second electrical data from said second dynamic random access memory and from said serial access memory port;

g) a first external write input pin for receiving an external first write enable signal;

h) a second external write input pin for receiving an external second write enable signal; and i) a logic control circuit electrically coupled to said first and said second external write input pins, wherein said logic control circuit generates a first internal write signal and a second internal write signal in response to said first and said second external write enable signals, and wherein said first internal write signal controls the transfer of data from said first serial access memory portion to said first dynamic random access memory portion and wherein said second internal write signal controls the transfer of data from said second serial access memory portion to said second dynamic random access memory portion, and wherein said first and said second internal write signals control the transfer of data between the random access memory port and said first and said second dynamic random access memory portions respectively.

9. A monolithic video dynamic access memory chip, comprising:

a) a dynamic access memory port;

b) a serial access memory port;

c) a first dynamic access memory in electrical communication with said dynamic access memory port;

d) a second dynamic access memory in electrical communication with said dynamic access memory port;

e) a first serial access memory electrically interposed between said first dynamic access memory and said serial access memory port;

f) a second serial access memory electrically interposed between said second dynamic access memory and said serial access memory port;

g) a first external write input pin for receiving an external first write enable signal;

h) a second external write input pin for receiving an external second write enable signal; and i) a logic control circuit electrically coupled to said first and said second external write input pins, wherein said logic control circuit generates a first internal write signal and a second internal write signal in response to said first and said second external write enable signals.

10. A monolithic video dynamic access memory chip, comprising:

a) a dynamic access memory port;

b) a serial access memory port;

c) a first dynamic access memory in electrical communication with said dynamic access memory port;

d) a second dynamic access memory in electrical communication with said dynamic access memory port;

e) a first serial access memory electrically interposed between said first dynamic access memory and said serial access memory port;

f) a second serial access memory electrically interposed between said second dynamic access memory and said serial access memory port;

g) first transfer circuitry electrically interposed between said first serial access memory and said first dynamic access memory;

h) second transfer circuitry electrically interposed between said second serial access memory and said second dynamic access memory;

i) a first external write input pin for receiving an external first write enable signal;

j) a second external write input pin for receiving an external second write enable signal; and k) a logic control circuit electrically coupled to said first and said second external write input pins and to said first and said second transfer circuitries, wherein said logic control circuit generates a first internal write signal and a second internal write signal in response to said first and said second external write enable signals, said first and said second internal write signals configured to control said first and said second transfer circuitries.

11. A monolithic video dynamic access memory chip, comprising:

a) a dynamic access memory port for accepting first electrical data;

b) a serial access memory port for accepting second electrical data;

c) a first dynamic access memory portion having a first plurality of memory storage cells for storing said first and said second electrical data, said first dynamic access memory portion in electrical communication with said dynamic access memory port;

d) a second dynamic access memory portion having a second plurality of memory storage cells for storing said first and said second electrical data, said second dynamic access memory portion in electrical communication with said dynamic access memory port;

e) a first serial access memory portion electrically interposed between said first dynamic access memory portion and said serial access memory port, said first serial access memory portion accepting and storing said first and said second electrical data from said first dynamic access memory and from said serial access memory port;

f) a second serial access memory portion electrically interposed between said second dynamic access memory portion and said serial access memory port, said second serial access memory portion accepting and storing said first and said second electrical data from said second dynamic access memory and from said serial access memory port;

g) a first external write input pin for receiving an external first write enable signal;

h) a second external write input pin for receiving an external second write enable signal; and i) a logic control circuit electrically coupled to said first and said second external write input pins, wherein said logic control circuit generates a first internal write signal and a second internal write signal in response to said first and said second external write enable signals.

12. A monolithic video dynamic access memory chip, comprising:

a) a dynamic access memory port for accepting first electrical data;

b) a serial access memory port for accepting second electrical data;

c) a first dynamic access memory portion having a first plurality of memory storage cells for storing said first and said second electrical data, said first dynamic access memory portion in electrical communication with said dynamic access memory port;

d) a second dynamic access memory portion having a second plurality of memory storage cells for storing said first and said second electrical data, said second dynamic access memory portion in electrical communication with said dynamic access memory port;

e) a first serial access memory portion electrically interposed between said first dynamic access memory portion and said serial access memory port, said first serial access memory portion accepting and storing said first and said second electrical data from said first dynamic access memory and from said serial access memory port;

f) a second serial access memory portion electrically interposed between said second dynamic access memory portion and said serial access memory port, said second serial access memory portion accepting and storing said first and said second electrical data from said second dynamic access memory and from said serial access memory port;

g) a first external write input pin for receiving an external first write enable signal;

h) a second external write input pin for receiving an external second write enable signal;

i) a logic control circuit electrically coupled to said first and said second external write input pins, wherein said logic control circuit generates a first internal write signal and a second internal write signal in response to said first and said second external write enable signals;

j) first transfer circuitry electrically interposed between said first serial access memory portion and said first dynamic access memory portion, said first transfer circuitry for transferring said second electrical data between said first serial access memory portion and said first dynamic access memory portion in response to said first internal write signal; and k) second transfer circuitry electrically interposed between said second serial access memory portion and said second dynamic access memory portion, said second transfer circuitry for transferring said second electrical data between said second serial access memory portion and said second dynamic access memory portion in response to said second internal write signal.

* * * * *